United States Patent [19]

Biro et al.

[11] Patent Number: 4,849,259
[45] Date of Patent: Jul. 18, 1989

[54] METHOD OF FORMING SILICON AND OXYGEN CONTAINING LAYERS

[75] Inventors: Laszlo Biro, Sindelfingen; Konrad Malin, Dettenhausen; Otto Schmid, Holzgerlingen, all of Fed. Rep. of Germany

[73] Assignee: International Business Machines Corporation, Armonk, N.Y.

[21] Appl. No.: 27,986

[22] Filed: Mar. 19, 1987

[30] Foreign Application Priority Data

Apr. 4, 1986 [EP] European Pat. Off. ........ 86104596.1

[51] Int. Cl.$^4$ .............................................. C23C 16/30
[52] U.S. Cl. .................................. 427/248.1; 427/255; 427/255.2; 427/255.3
[58] Field of Search .................. 427/85, 87, 95, 248.1, 427/255, 255.2, 255.3

[56] References Cited

U.S. PATENT DOCUMENTS

| | | | |
|---|---|---|---|
| 3,158,505 | 11/1964 | Sandor | 117/215 |
| 3,571,914 | 3/1971 | Lands et al. | 427/85 |
| 3,934,060 | 1/1976 | Burt et al. | 427/248.1 |
| 4,557,950 | 12/1985 | Foster et al. | 427/255 |
| 4,619,844 | 10/1986 | Pierce et al. | 427/248.1 |

FOREIGN PATENT DOCUMENTS 2132230 12/1982 United Kingdom .

OTHER PUBLICATIONS

Powell et al., "Vapor Deposition", pp. 391–397, 401–402 and 604–606, 1967, TS695 P6.
Oroshnik et al., "Pyrolytic Deposition of Silicon Dioxide in an Evacuated System", J. Electrochem. Soc.: Solid State Science, pp. 649–652, Jun. 1968, vol. 115, No. 6.
Smolinsky et al., "Measurements of Temperature Dependent Stress of Silicon Oxide Films Prepared by a Variety of CVD Methods" J. Electrochem. Soc.: Solid-State Science and Technology, vol. 132, No. 4, pp. 950–954, Apr. 1985.
Journal of the Electrochemical Soc., Band 118, Nr. 9, Sep. 1971, pp. 1540–1542; J. Wong et al., "Chemical Vapor Deposition of Arsenosilicate Glass: A One-Liquid-Source System".
IBM Technical Disclosure Bulletin, vol. No. 8, Jan. 1966, p. 1141, W. Hoffmeister et al., "Producing Doped Silicon Dioxide Layers".

Primary Examiner—Sadie Childs
Attorney, Agent, or Firm—Anne Vachon Dougherty; Alexander Tognino

[57] ABSTRACT

Layers containing silicon and oxygen are formed by means of low pressure chemical vapor deposition. As a source for silicon and oxygen, tetraethylorthosilicate (TEOS) is used which is drawn into the low pressure area of the deposition apparatus in liquid form and evaporated there. If necessary, oxygen is introduced into the low pressure area. The reactants are directed into the reaction zone which has been heated to a predetermined temperature, and reacted there. The reaction product is deposited onto the substrates provided therein. If the deposited layer is to comprise still further elements, liquid substances containing such elements are mixed with the liquid TEOS prior to being drawn into the evaporating area, in a ratio adapted to the desired layer composition. Both with respect to layer thickness and composition the layers deposited are highly homogeneous.

20 Claims, 2 Drawing Sheets

METHOD OF FORMING SILICON AND OXYGEN CONTAINING LAYERS

DESCRIPTION

The invention relates to a method of making silicon and oxygen containing layers by means of chemical vapor deposition onto substrates at reduced pressure. Tetraethylorthosilicate (TEOS) serves as a source for silicon and oxygen to be directed over the substrates which are heated to a predetermined temperature.

Such a method is known from the article "Pyrolytic Deposition of Silicon Dioxide in an Evacuated System" by J. Oroschnik and J. Kraitchman, published in the Journal of the Electrochemical Society, Vol. 115, No. 6, June 1968, p. 649. In this process, where vapor TEOS is drawn into the evacuated reaction space, reasonably homogeneous layer thicknesses on the individual substrates and over an extended number of substrates are achieved only under the condition of a low deposition rate. It is furthermore difficult to reproducibly produce predetermined layer thicknesses. This known method can also be used for providing gaseous substances other than, or in addition to, TEOS, for example, gases containing phosphorus and/or boron for making layers which apart from, or in addition to, silicon and oxygen also comprise such other elements (see the article "Measurements of Temperature Dependent Stress of Silicon Oxide Films Prepared by a Variety of CVD Methods" by G.Smolinski and T.P.H.F. Wendling, published in the Journal of the Electrochemical Society, Vol. 132, No. 4, April 1985, pp. 950 ff.). This variation of the known process is also confronted with the aforementioned problems in connection with homogeneity and reproducibility. It appears that these problems, encountered in the production of only silicon and oxygen containing layers, are due to the fact that the vapor quantity over the liquid TEOS which depends in part on the temperature of the TEOS source material, is difficult to control. Control by means of this method is further complicated by the considerable volume expansion which the TEOS vapor undergoes when entering the low pressure area of the device. This volume expansion is, necessarily, dependent on the respective vacuums. Furthermore, the liquid TEOS, which is connected to the low pressure range via valves, is repeatedly subjected to uncontrollable delays in boiling, where suddenly and for a short period, large quantities of TEOS uncontrollably reach the low pressure range. It is speculated that the vast pressure differentials are due to a total evacuation of the surface TEOS before vaporization of the "underlying" material. The above mentioned variations of quantities of TEOS reaching the low pressure area of the device cause variations of the TEOS quantity available at the substrate during the growth process, which not only affect reproducibility of the growth speed, but also cause locally different reaction conditions, and consequently different growth speeds.

In the production of layers additionally containing other materials the above-described problems arise not only with respect to one, but two or three source materials, so that added to the poor reproducibility and poor homogeneity in layer thickness, there is poor reproducibility and inhomogeneity of layer composition.

It is therefore the object of the invention to provide a method for making layers of uniform thickness and uniform composition on substrates within small tolerances, under manufacturing conditions and with acceptable growth speeds.

BRIEF DESCRIPTION OF THE DRAWINGS

This and other objectives are achieved by the subject invention wherein the quantity of TEOS supplied to the surfaces on which silicon and oxygen layers are to be deposited is controlled by vaporizing the liquid source material before supplying same to the reaction chamber.

Layers made in accordance with the invention are homogeneous not only over the individual substrates but over "batches" having a high number of simultaneously-treated substrates. The control is very simple, and does not require greater efforts than in the presently practiced processes. The layers made, however, are of a high quality; for example, they are free of haziness, and they have the adhesion and density characteristics of a thermal oxide, without the deleterious penetration of same.

For making layers which, in addition to silicon and oxygen, comprise at least one further element, at least one material containing the element to be included is advantageously admixed to the liquid TEOS, so that the number of preparative steps involved is actually fewer than in the production of multi-component layers in accordance with the known methods, where the source materials are separately introduces into the reaction zone. The correlation between the composition of the fluid mixture of reactants and the composition of the grown-on layer can be determined by means of uncomplicated tests. The thus-made layers are of considerable homogeneity, not only with regard to the layer thickness but also with respect to the layer composition within the individual substrates as well as within a simultaneously-treated plurality of substrates.

Figure 1:
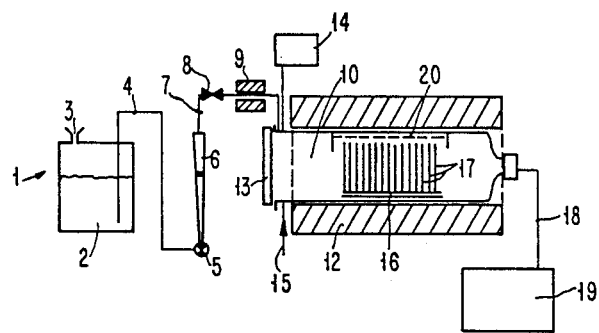

In the following, the invention will be described with reference to embodiments described by the drawings wherein:

FIG. 1 is a schematic cross section of a device suitable for implementing the method as disclosed by the invention.

Figure 2:
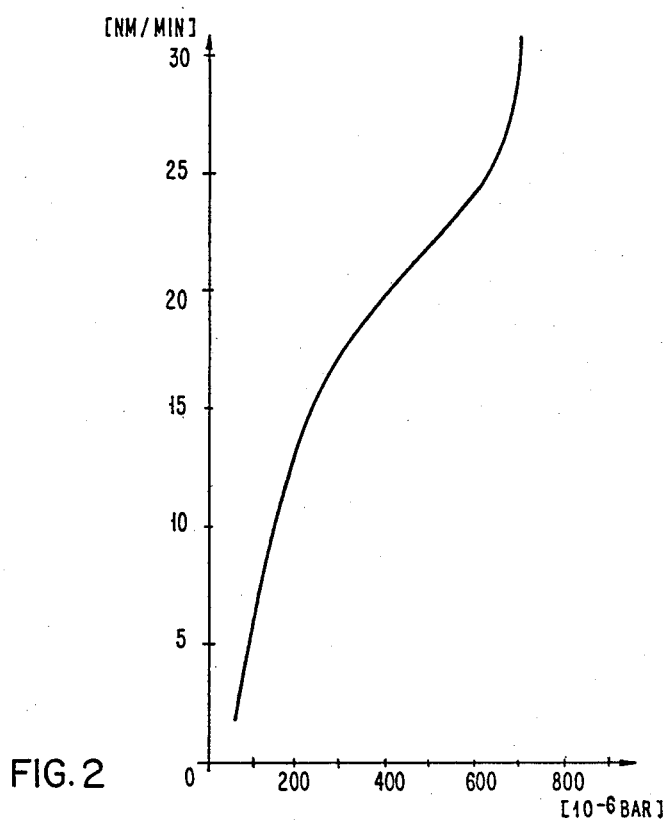

FIG. 2 is a graph illustrative of the growth speed of a layer containing silicon and oxygen, plotted against the partial pressure of the TEOS at the place of deposition at 730° C.

Figure 3:
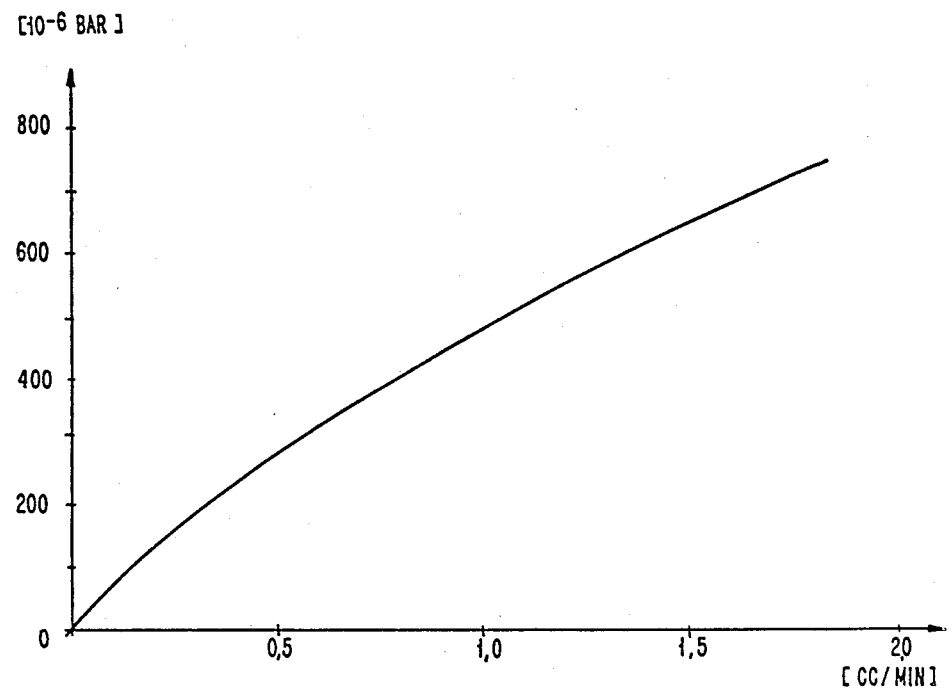

FIG. 3 is a graph of the overall pressure of a mixture consisting of TEOS, triethylphosphite and trimethylborate at the place of deposition at 730° C., plotted against the flow speed of the fluid mixture of the reactants.

To implement the method as disclosed by the invention a device such as that illustrated in FIG. 1 can be used, but is equally possible to use variations of this device.

DETAILED DESCRIPTION OF THE INVENTION

The device, as illustrated in FIG. 1, comprises a source vessel 1 into which the liquid source 2 is filled through filling funnel 3. A tube 4 reaches almost down to the bottom of the source vessel 1, so that when the source material is introduced into the vessel, the tube is immersed therein. Tube 4 is followed by a needle valve 5 and a flowmeter 6. Needle valve 5 is used to monitor the amount of fluid source material drawn into the low pressure area per unit time. The low pressure area begins at needle valve 5. Flowmeter 6 is followed by a tube 7 through which the source material is transported into the reaction chamber 10. Installed in tube 7 is a gate valve 8 to block or permit the influx of source material. Tube 7 is directed through a pre-heater 9 where the source material is evaporated completely. Reaction chamber 10 is a cylindrical tube whose diameter is determined by the dimensions of the substrates, 17, on which the silicon and oxygen containing layers are to be deposited, for example, semiconductor wafers. At one end reaction chamber, 10, is closed with door 13 in a vacuum-tight seal. At the other end of the reaction chamber, pump 19 evacuates the chamber and carries off impurities, effluents and residual source material via tube 18. Pump 19 consists, for example, of a pump combination formed of a pre-pump and a root pump, with a suction rate of approximately 240 m$^3$ per hour. In order to load a boat 16 containing substrates 17 into the reaction chamber 10, door 13 can be opened. Pressure gate 14 measures the pressure in reaction chamber 10. For feeding gases into reaction chamber 10 supply line 15 is provided. The reaction chamber 10 is surrounded by a tubular furnace 12 which generates the necessary heat in reaction chamber 10.

In the following, the method of making layers containing only silicon and oxygen using the device depicted in FIG. 1 will be discussed in detail. A step for cleaning reaction chamber 10 may be necessary prior to executing the inventive method. The cleaning step is carried out with HCl gas which is fed into reaction chamber 10 through inlet tube 15, and removed through tube 18. In a predetermined area in the clean reaction chamber, 10, boat 16 containing semiconductor wafers as substrates 17 is positioned. Subsequently, after a rinsing with nitrogen, there follows an evacuation process and the respective temperature in reaction tube 10 is set. Preferably, this temperature is between approx. 700° and approx. 750° C., with preferences at approx. 730° C. The choice of temperature within the above-mentioned range substantially defines the length of the reaction chamber, the so-called reaction zone marked 20 in FIG. 1, throughout which homogeneous precipitation of layer material can be performed. Further parameters influencing the length of the reaction zone which will be exposed to a uniform precipitate speed are the free path of the source material molecules, and the partial pressures of the source materials. If a high temperature is chosen, the reaction speed will increase considerably, and the precipitate area will be reduced as a consequence. Inversely, the precipitate area will be relatively large if a low temperature has been fixed. If the temperature is set to 730° C., a reaction zone with uniform deposition speed which can easily encompass 50 semiconductor wafers, and a reasonable speed of deposition (in the order of 5 to 25 nm per minute) can be realized simultaneously.

When the reaction chamber and substrates have reached the predetermined temperature, valve 8 is opened so that the liquid source, for example TEOS, can be drawn from source vessel 1 into the low pressure area. Needle valve 5 is set in such a manner that preferably between approx. 0.1 and approx. 1.0 cm$^3$ fluid TEOS per minute can be provided into the low pressure area. The liquid source material immediately starts evaporating. Since it is preferable that only gaseous material reach the high temperature area of the reaction chamber, the device used should comprise a pre-heater 9 which is preferably heated to a temperature between approx. 100° and approx. 200° C. to insure complete evaporation of the source material before introduction of same into the reaction chamber. The above mentioned quantity of vaporous TEOS corresponds to a partial pressure area of TEOS in the reaction chamber of between approx. 70 and approx. 700 μbar. As shown in the diagram of FIG. 2, at 730° C., this partial pressure corresponds to a thickness growth on the substrates of between approx. 5 and approx. 25 nm per minute. Once the layer has grown to the desired thickness, the process is interrupted by closing valve 8. There follows a rinsing process, using, for example, nitrogen introduced through inlet tube 15.

In test vehicles, the homogeneity of a grown layer has been observed to be ±2% within the semiconductor wafers, and within the entire batch consisting of 53 wafers, it was ±3%. Observations are that the grown layer does not consist of pure silicon dioxide; but rather, the layers have oxygen contents below the stoichiometric value.

If it is desired that the layer consist of silicon dioxide exclusively, it is advantageous to provide a small quantity of oxygen into the reaction chamber, through tube 15, during deposition in order to make the oxygen percentage in the reaction mixture slightly over-stoichiometric. To give an example: If 0.2 cm$^3$ of liquid TEOS per minute are provided to the low pressure area, an additional quantity of 20 cm$^3$ of oxygen gas per minute (the total vapour pressure of the reactant then being increased by approx. 70 μbar in the deposition area) could be introduced. The layers made following this variation of the method as disclosed by the invention have the same uniform thickness as those made without the added oxygen with no haziness or precipitations. Furthermore, the layers are not hygroscopic; they have a refraction index n of 1.45± 0.02; and, they can replace thermal oxide. Therefore, the layers made in accordance with the invention can be used in all those instances where previously thermal oxide had been preferred, for example, as diffusion masks in semiconductor technology, and as dielectrics on semiconductor components.

In the following, the use of the method as disclosed by the invention will be discussed for the production of layers which, in addition to silicon and oxygen, comprise at least one further element selected, for example, from the group comprising arsenic, phosphorus and boron. Virtually the same device employed in the production of layers containing silicon and oxygen alone can be used.

The main difference, as compared with the above described production of layers containing silicon and oxygen alone, is that apart from TEOS the fluid source material contains fluid compounds of the elements to be additionally introduced into the layer. As a source for phosphorus, triethylphosphite (TEP), or trimethylphosphite can preferably be used; as a source for arsenic, triethylarsenite (TEA) can be used; and, as a source for boron, trimethylborate (TMB), triethylborate or tripropylborate can be used. The particular combination of source materials required to obtain a specific layer composition can be determined by simple tests, which will be readily apparent to one having skill in the art. The combination of source materials also influences the speed of the deposition. For example, the deposition speed decreases with increasing TEP contents, whereas it increases with increasing TMB contents. If the source material comprises TEP as well as TMB the quantity ratio of the two compounds dictates whether the deposition speed is increased or decreased by the admixtures.

Once again, the temperature of the deposition area is preferably set to a value between approx. 700° and approx. 750° C. The source material drawn into the low pressure area of the device is preferably between 0.2 and 1.7 cm$^3$ per minute which, as indicated in curve 1 of FIG. 3 correspond, for a source material comprising apart from TEOS 12.6 percent by weight TMB and 14.7 percent by weight TEP to a partial pressure of between approx. 133 and approx. 693 μbar. Under these conditions glass layers are deposited on the substrates. Experimental results indicate the homogeneity of the layer thickness over a substrate, e.g. a semiconductor wafer of 100 mm diameter to be ±3.5%. Homogeneity across a batch of wafers treated simultaneously was ±5.5%.

The reaction mixture should preferably comprise an oxygen percentage slightly higher than that required stoichiometrically for forming the most stable oxides of the silicon and the additional elements. For that reason, oxygen is preferably introduced into the reaction source and/or reaction tube as an additional source material. The oxygen quantity introduced is typically between approx. 100 and 250 cm$^3$ per minute (this increases the overall pressure of the reactants in the deposition range to between approx. 240 and 600 μbar). Apart from the oxygen admixture, the remaining deposition conditions are the same as if the process would be implemented without oxygen being admixed. The layers made by means of this variation of the method as disclosed by the invention do not only have the desired "stoichiometric" composition but are in fact noted for their highly homogeneous composition, within the substrates as well as within the entire batch. Similar to the process without admixed oxygen, the layer thickness homogeneity was ±3.5% within a substrate (in the form of semiconductor wafers with a 100 mm diameter), and ±5.5% within the entire batch consisting of a plurality of semiconductor wafers, on the order of 50. The layers produced consist of glass and are meltable. They are without haziness or precipitates. Their index of refraction, n, is between approx. 1.44 and approx. 1.45. Furthermore, the layers have a uniform etching speed for wet as well as for plasma etching over the thickness of the layer. Layers which, apart from silicon and oxygen, also include boron and phosphorus are used for passivating and planarizing semiconductor surfaces. Layers which, apart from silicon and oxygen, comprise boron or phosphorus or arsenic,(i.e. only one additional element) are employed not only in the passivation and planarization of semiconductor surfaces, but also as diffusion sources in the doping of semiconductor material with the above mentioned elements through diffusion.

In the following, the method as disclosed by the invention will be specified with reference to two examples. In the first example, the production of a silicon dioxide layer, and in the second example, the making of a glass comprising phosphorous oxide, boron oxide and silicon dioxide is described.

The following conditions are the same for both examples: A device was used as depicted in FIG. 1 in a schematic representation. The diameter of the reaction chamber was approx. 180 mm, and it had a length of 200 cm (length of the tubular furnace=180 cm). The temperature in the deposition area was fixed at 730° C. Oxygen was added to the reaction mixture. Objects to be coated were 50 semiconductor wafers with a diameter of 100 mm each and which were arranged perpendicularly to the direction of suction in three quartz boats, in a reaction zone of 60 cm length. The evaporation of the fluid source materials was supported by pre-heater 9 heated to 120° C.

EXAMPLE 1

First, the low pressure area was evacuated, and the reaction chamber containing the semiconductor wafers was heated to the predetermined temperature. Subsequently, 0.2 cm$^3$ TEOS per minute (corresponding to a partial pressure in the deposition area of approx. 130 μbar) were drawn into the low pressure area, and 20 cm$^3$ oxygen (through this admixture the overall pressure of the reactants in the deposition area is increased by approx. 70 μbar) were introduced into the reaction chamber. The growth speed of the silicon dioxide layer was approx. 15 nm per minute. The growing process extended over one hour approximately. The grown SiO$_2$-layer was 900 nm thick, with the variations being in the above mentioned scope of ±2% within the semiconductor wafers and ±3% within the entire batch. The layer grown on the wafers had the above described characteristics.

EXAMPLE 2

Into source vessel 1 a source material mixture containing 14.7 percent by weight TEP, 12.6 percent by weight TMB and 72.7 percent by weight TEOS was provided. After the low pressure area had been evacuated, and the reaction chamber containing the semiconductor wafers heated to the fixed temperature 0.7 cm$^3$ of source material (corresponding to a partial pressure in the deposition area of approx. 460 μbar) was drawn into the low pressure area, and 100 cm$^3$ oxygen (this admixture results in an overall vapour pressure of the reactants in the deposition area of approx. 700 μbar) was provided to the reaction chamber. The growth speed of the layer was approx. 15 nm per minute. The growing process extended over one hour. The layer grown on the semiconductor wafers had a thickness of 900 nm, with the variation of the layer thickness over the semiconductor wafers being ±3.5%, and over the inserted 50 semiconductor wafers ±5.5%. The glass layer grown comprised 2.5 percent by weight phosphorus, and 4 percent by weight boron. The homogeneity of the composition over the semiconductor wafers and the entire batch was excellent. Furthermore, the glass layer grown on the semiconductor wafers showed the characteristics specified above.

The foregoing descriptions represent examples of the broad invention. The temperature and pressure ranges, along with the lengths, number of sample wafers and growth levels are meant to be representative. One having skill in the art will recognize variations with respect to the subject invention which are within the spirit and scope of the invention and of the appended claims.

What is claimed is:

1. A method for providing at least one an homogeneous layer containing silicon and oxygen to at least one substrate in a reaction chamber comprising the steps of:
   evacuating said chamber;
   elevating the temperature of said at least one substrate in said chamber; and
   providing a constant pressure of gaseous TEOS in said chamber for a predetermined time, said gaseous TEOS being a reaction source and wherein said constant pressure is provided by the steps of filling a reservoir with liquid TEOS; providing a low pressure area between said reservoir and said reaction chamber; said pressure selected to allow a predetermined amount of said liquid TEOS to be continually drawn from said reservoir; and, providing a vaporizing means in said low pressure area whereby said means is completely vaporizing to the drawn liquid TEOS before same enters said reaction chamber.

2. The method of claim 1 wherein said providing vaporizing means comprises a heater.

3. The method of claim 2 wherein said vaporizing comprises heating said drawn TEOS to between about 100° C. and 200° C.

4. The method of claim 1 wherein said temperature-elevating step comprising elevating the temperature of said at least one substrate to between approximately 700° C. and 750° C.

5. The method of claim 4 wherein said substrate temperature is elevated to 730° C.

6. The method of claim 1 further comprising the step of:
introducing oxygen gas to said reaction source thereby providing an oxygen percentage in said reaction source which is over-stoichiometric.

7. The method of claim 1 wherein said gaseous TEOS is provided to said chamber at a constant pressure of between approx. 70 and 700 $\mu$bar.

8. The method of claim 6 wherein said gaseous TEOS is provided to said chamber at a constant pressure of approx. 130 $\mu$bar and said oxygen is provided to said chamber at a pressure of approx. 70 $\mu$bar.

9. The method of claim 1 wherein said predetermined time is determined by the linear relationship at constant pressure of time to desired depth of said layer.

10. The method of claim 1 wherein it is further desired to provide at least one element in addition to silicon and oxygen in the at least one layer comprising:
adding at least one additional element-containing source material to said liquid TEOS prior to providing said liquid TEOS to the low pressure area between the reservoir and the reaction chamber.

11. The method of claim 10 wherein said at least one additional source material is added in liquid phase to said liquid TEOS in a percent of the total liquid volume calculated to correspond to the percent of said element desired in said layer, and whereby said additional source material is vaporized with said TEOS.

12. The method of claim 10 wherein said at least one additional source material is added in gaseous phase to said vaporized TEOS source prior to providing said source to the reaction chamber.

13. The method of claim 10 wherein a compound selected from the group comprising triethylphosphite and trimethylphosphite is added to said TEOS as an additional source for phosphorous in said at least one layer.

14. The method of claim 10 wherein triethylarsenite is added to said TEOS as an additional source of material for arsenic in said at least one layer.

15. The method of claim 10 wherein a compound selected from the group comprising trimethylborate, triethylborate, and tripropylborate is added to said TEOS as an additional source for boron in said at least one layer.

16. The method of claim 10 additionally comprising the step of:
introducing oxygen gas to said reaction source thereby providing an oxygen percentage in the reaction source which is over-stoichiometric for forming stable oxides of the silicon and of the additional element or elements.

17. The method of claim 10 wherein said adding step involves adding to said source material amounts of triethylphosphite and trimethylborate to yield a source material comprising 72.7 percent by weight of TEOS, 14.7 percent by weight of triethylphosphite and 12.6 percent by weight of trimethylborate and wherein approximately 0.7 cm$^3$ of said source material is provided per minute to grow a glass layer comprising approximately 2 percent by weight of phosphorous and approximately 4 percent by weight of boron.

18. The method of claim 17 further comprising the step of:
introducing 100 cm$^3$ of oxygen gas per minute to said deposition chamber.

19. The method of claim 16 wherein said gaseous TEOS is provided to said reaction chamber at a rate of about 0.1 to about 1.0 cm$^3$ per minute.

20. The method of claim 19 wherein said gaseous TEOS is provided to said reaction chamber at a rate of 0.2 cm$^3$ per minute and said oxygen gas is provided at a rate of 20 cm$^3$ per minute.

* * * * *

UNITED STATES PATENT AND TRADEMARK OFFICE
CERTIFICATE OF CORRECTION

PATENT NO. : 4,849,259

DATED : July 18, 1989

INVENTOR(S) : Laszlo Biro, Konrad Malin, & Otto Schmid

It is certified that error appears in the above-identified patent and that said Letters Patent is hereby corrected as shown below:

Column 8, line 1, delete "10" and insert --1--.
Column 8, line 1, delete "said".
Column 8, line 39, delete "16" and insert --6--.

Signed and Sealed this

Seventeenth Day of July, 1990

Attest:

HARRY F. MANBECK, JR.

Attesting Officer

Commissioner of Patents and Trademarks